(12) United States Patent
Koshizuka

(10) Patent No.: US 8,576,652 B2
(45) Date of Patent: Nov. 5, 2013

(54) SEMICONDUCTOR MEMORY DEVICE, MEMORY SYSTEM INCLUDING MEMORY CONTROLLER, AND REFRESH CONTROL METHOD FOR A SEMICONDUCTOR MEMORY DEVICE

(75) Inventor: Atsuo Koshizuka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 106 days.

(21) Appl. No.: 12/686,790

(22) Filed: Jan. 13, 2010

(65) Prior Publication Data

US 2010/0177583 A1 Jul. 15, 2010

(30) Foreign Application Priority Data

Jan. 14, 2009 (JP) .................................. 2009-005663
Jan. 12, 2010 (JP) .................................. 2010-003711

(51) Int. Cl.
*G11C 7/00* (2006.01)
(52) U.S. Cl.
USPC ............................ 365/222; 365/226; 365/229
(58) Field of Classification Search
USPC ................. 365/222, 189.07, 191, 193, 233.1, 365/233.11, 233.12, 233.15, 226–229
See application file for complete search history.

(56) References Cited

U.S. PATENT DOCUMENTS 6,438,055 B1 * 8/2002 Taguchi et al. ............... 365/222
6,717,884 B2 * 4/2004 Kim ................................ 365/51
7,826,304 B2 * 11/2010 Jang ........................... 365/233.1

FOREIGN PATENT DOCUMENTS

| JP | 59-129987 A | 7/1984 |
| JP | 2000-339955 A | 12/2000 |
| JP | 2001-076500 A | 3/2001 |
| JP | 2002-358231 A | 12/2002 |
| JP | 2005-332538 A | 12/2005 |
| JP | 2006-031929 A | 2/2006 |
| JP | 2006-155841 A | 6/2006 |

\* cited by examiner

*Primary Examiner* — Kretelia Graham
(74) *Attorney, Agent, or Firm* — Sughrue Mion, PLLC

(57) ABSTRACT

A semiconductor memory device has an operation mode in which a read/write operation is performed in response to a command supplied externally in synchronization with a clock, and a power-down mode in which no external read/write command is accepted. The semiconductor memory device performs a refresh operation in response to an externally supplied signal during the power-down mode. A memory system has a plurality of the semiconductor devices and a memory controller. The memory controller outputs a control signal during the power-down mode, and the plurality of semiconductor devices perform a refresh operation in response to the control signal during the power-down mode.

9 Claims, 11 Drawing Sheets

SEMICONDUCTOR MEMORY DEVICE, MEMORY SYSTEM INCLUDING MEMORY CONTROLLER, AND REFRESH CONTROL METHOD FOR A SEMICONDUCTOR MEMORY DEVICE

REFERENCE TO RELATED APPLICATION

This application is based upon and claims the benefit of the priority of Japanese patent applications No. 2009-005663 filed on Jan. 14, 2009, and No. 2010-003711 filed on Jan. 12, 2010, the disclosures of which are incorporated herein in their entirety by reference thereto.

TECHNICAL FIELD

The present invention relates to a semiconductor memory device, memory system including a memory controller, and refresh control method for a semiconductor memory device, and particularly to a refresh control of a semiconductor device having power-down mode during the power-down mode.

BACKGROUND

The improvements in the capacity and speed of semiconductor memory devices such as dynamic RAM have been quite remarkable. Particularly, in DDR SDRAM (Double Data Rate Synchronous DRAM), while internal operations are pipelined and commands supplied externally in synchronization with a clock are sequentially executed, high-speed system operation is achieved by performing data transfer at a rate twice the clock frequency. In the aforementioned DDR SDRAM, a high-speed data transfer is achieved by using a DLL (Delay Locked Loop) circuit and having internal circuits operate in synchronization with an external clock.

Meanwhile, the reduction of power consumption for semiconductor memory devices is demanded not only in the fields of devices operating with batteries such as laptops, but also in the field of servers. However, the aforementioned improvements in capacity and speed may increase power consumption.

Therefore, there is demand for a technology that boosts the capacity and speed of a semiconductor memory device without increasing power consumption.

Patent Document 1 describes a synchronous memory device that smoothly changes from auto-refresh mode to self-refresh mode in response to a power-down command.
[Patent Document 1] Japanese Patent Kokai Publication No. JP-P2006-31929A

SUMMARY

The entire disclosure of Patent Document 1 is incorporated herein by reference thereto.

The following analysis is given by the present invention. As in the case of Patent Document 1, the entire power consumption can be reduced by switching to a low power consumption mode when there is no access. As a low power consumption mode, there are the self-refresh mode in Patent Document 1 and a power-down mode that does not perform self-refresh. However, the both modes have a problem that read/write access cannot be performed smoothly when read/write access is necessary.

First, when the device is switched to the self-refresh mode as in Patent Document 1, a memory controller is unable to know the timing at which self-refresh is performed. One round of self-refresh operation normally requires a time period of approximately 100 ns to 200 ns, and the memory controller cannot perform an access operation unless it waits for that time period (tRFC) when the memory controller tries to cancel the self-refresh mode.

Further, when the device switches to the power-down mode that does not perform self-refresh, it is necessary to cancel the power-down mode at every predetermined number of cycles and supply a refresh command from the memory controller. FIG. 1 is a timing chart of the power-down mode. After a refresh command has been supplied at time Tm, a clock enable signal CKE goes to a low level from a high level at the falling edge of the clock at time T0, and the clock can be stopped after a time period not less than time tCKSRE has elapsed since the next rising edge of the clock (T1). However, since the contents of the memory cannot be maintained if the power-down mode continues longer than a predetermined time period tPD, it is necessary to cancel the power-down mode and supply a refresh command within the time tPD. The value of tPD is determined by the following expression (1) where tRFFI is the normal refresh interval.

$$tPDmax=9*tREFI \qquad \text{Expression (1)}$$

Therefore, in the power-down mode, the maximum number of refresh operations that can be postponed is 9. For instance, tPDmax is several tens of microseconds when tRFFI is several microseconds. Therefore, as long as the power-down mode is canceled and a refresh operation is performed within tPDmax, the semiconductor memory device can stay in the power-down mode during that time and low power consumption can be achieved.

However, when the system controller needs to access the semiconductor memory device during this power-down mode, a maximum of nine rounds of postponed refresh commands must be consecutively executed in order to restore the execution of the postponed refresh commands, depending on the duration time of the power-down mode. This will hinder high-speed operation after the power-down mode has been canceled.

There is demand for a semiconductor memory device, memory system, and refresh control method for a semiconductor memory device, capable of standing by in low-power consumption mode when there is no need for read/write access and of being accessed without a delay when read/write access is necessary.

A semiconductor memory device according to a first aspect of the present invention in which a refresh operation for data written in a memory cell is carried out in response to a refresh control signal, includes a command decoder that generates a refresh command signal, based on a command supplied from outside of the semiconductor memory device in synchronization with a clock signal during an operation mode. The semiconductor memory device further includes a control logic that generates the refresh control signal based on the refresh command signal during the operation mode. The control logic generates the refresh control signal based on a first signal during a power-down mode when the clock signal is invalidated. The first signal is different from the refresh command signal and is entered from outside of the semiconductor memory device.

A memory controller according to a second aspect of the present invention connected to a semiconductor device including a memory cell, includes a memory control unit that, during a operation mode that allows the semiconductor device to deal with an access to the information data from outside, periodically outputs a command that permits the semiconductor device to perform a refresh operation for data written in the memory cell. The memory controller further includes a power-down mode refresh control unit that, during the power-down mode that inhibits the semiconductor device from dealing with an access to the information data from outside, periodically outputs a first signal, different from the command, to the semiconductor device to execute the refresh operation.

A memory system according to a third aspect of the present invention includes a semiconductor device and a memory controller that controls the semiconductor device. The semiconductor device includes a memory cell array having a plurality of information data. The semiconductor device receives a command that allows the semiconductor device to execute an access to the information data from outside, a clock signal that synchronously controls the command, a chip select signal that selects the semiconductor device, and a clock enable signal that internally invalidates the clock signal to inhibit the semiconductor device from dealing with an access to the information data from outside. In case the semiconductor device is in the operation mode that allows the semiconductor device to deal with an access to the information data from outside, the memory controller delivers the command, the clock signal, the chip select signal, and the clock enable signal to the semiconductor device and periodically issues a command for refreshing data retained in the memory cell array. The memory controller in case the semiconductor device is in the power down mode that inhibits the semiconductor device from dealing with an access to the information data from outside refreshing the memory cell array based on the clock enable signal and on the chip select signal that is periodically issued.

The meritorious effects of the present invention are summarized as follows.

According to the present invention, a semiconductor memory device, memory system, and refresh control method for a semiconductor memory device, capable of standing by in low-power consumption mode when there is no need for read/write access and of being accessed without a delay when read/write access is necessary can be achieved.

BRIEF DESCRIPTIONS OF THE DRAWINGS

PREFERRED MODES

Figure 1:
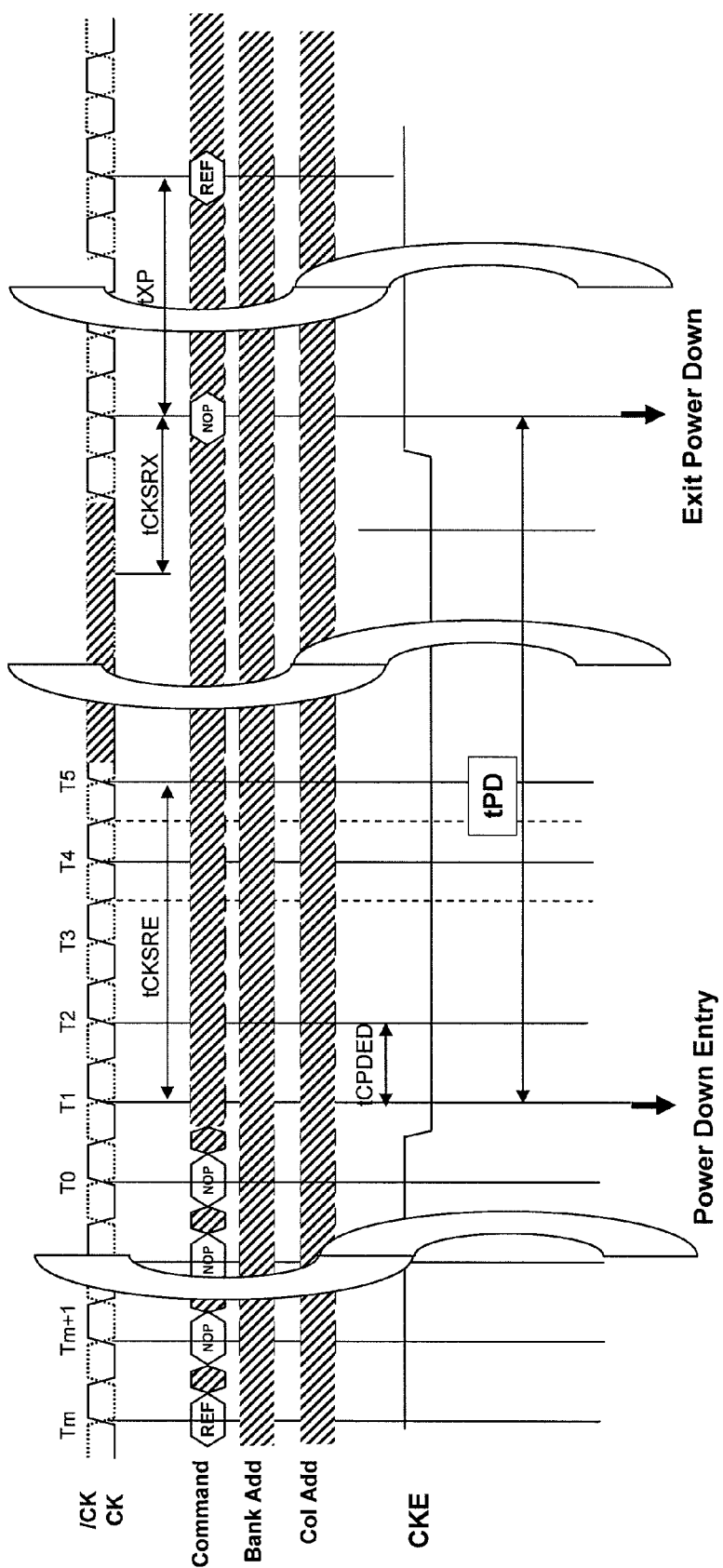
FIG. 1 is a timing chart of a power-down mode in a conventional semiconductor memory device.

Modes of the present invention will be described with reference to the drawings as necessary. It should be noted that the drawings and symbols in the drawings referred to in the description of preferred modes are used to describe an example of a preferred mode, and they do not limit variations of the preferred modes of the present invention.

For instance, as shown in FIGS. 2 to 7, a semiconductor memory device 1 of a mode of the present invention responds to a command supplied externally in synchronization with a clock, has an operation mode (before Power Down Entry and after Exit Power Down in FIGS. 5 and 7) that performs read/write operations, and a power-down mode (from Power Down Entry to Exit Power Down) that does not accept any external read/write command, and performs a refresh operation during the power-down mode in response to a signal (CS#) externally supplied. Since a refresh operation is performed during the power-down mode in response to an externally supplied signal (CS#), the system controller is able to know the timing at which the refresh operation is performed if the signal (CS#) is supplied from a memory controller. Therefore, unless it so happens that read/write access becomes necessary immediately after a refresh command is supplied based on the signal (CS#), read/write access can be promptly performed after the power-down mode is canceled unlike the case of the self-refresh mode that always has to wait during the self-refresh time. Further, since refresh operations do not have to be intensively performed after the power-down mode is canceled as long as refresh operations are performed on a regular basis during the power-down mode, high speed access after the cancellation of the power-down mode does not get hindered. Further, the limit (tPDmax) on the duration of the power-down mode can be eliminated.

Further, for instance, as shown in FIGS. 2 to 4, and 6, the semiconductor memory device 1 of a mode of the present invention comprises a dynamic memory cell array 10, refresh control circuits (11, 12, 19) that refresh memory cell data of the dynamic memory cell array 10 upon receiving a refresh control signal REFC, a command decoder 14 that decodes a command and outputs a refresh command signal REFCOM when the decoded command is a refresh command, and a refresh signal selection circuit 43 that outputs the refresh command signal REFCOM during the operation mode and outputs the externally supplied signal CS# as the refresh control signal REFC during the power-down mode.

Figure 4:
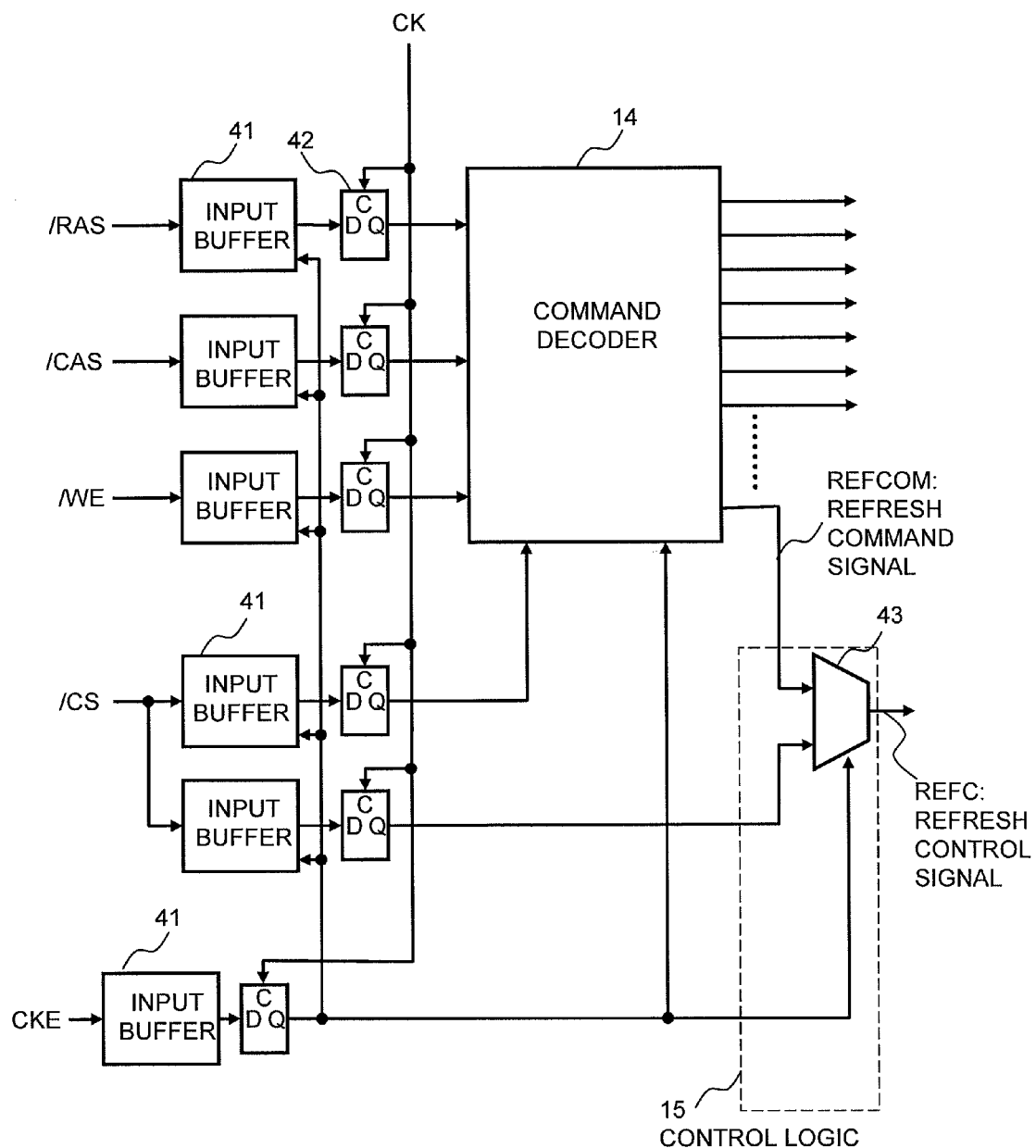
FIG. 4 is a circuit diagram showing an area surrounding a refresh control signal generation circuit in the semiconductor memory device according to an example of the present invention.
Figure 6:
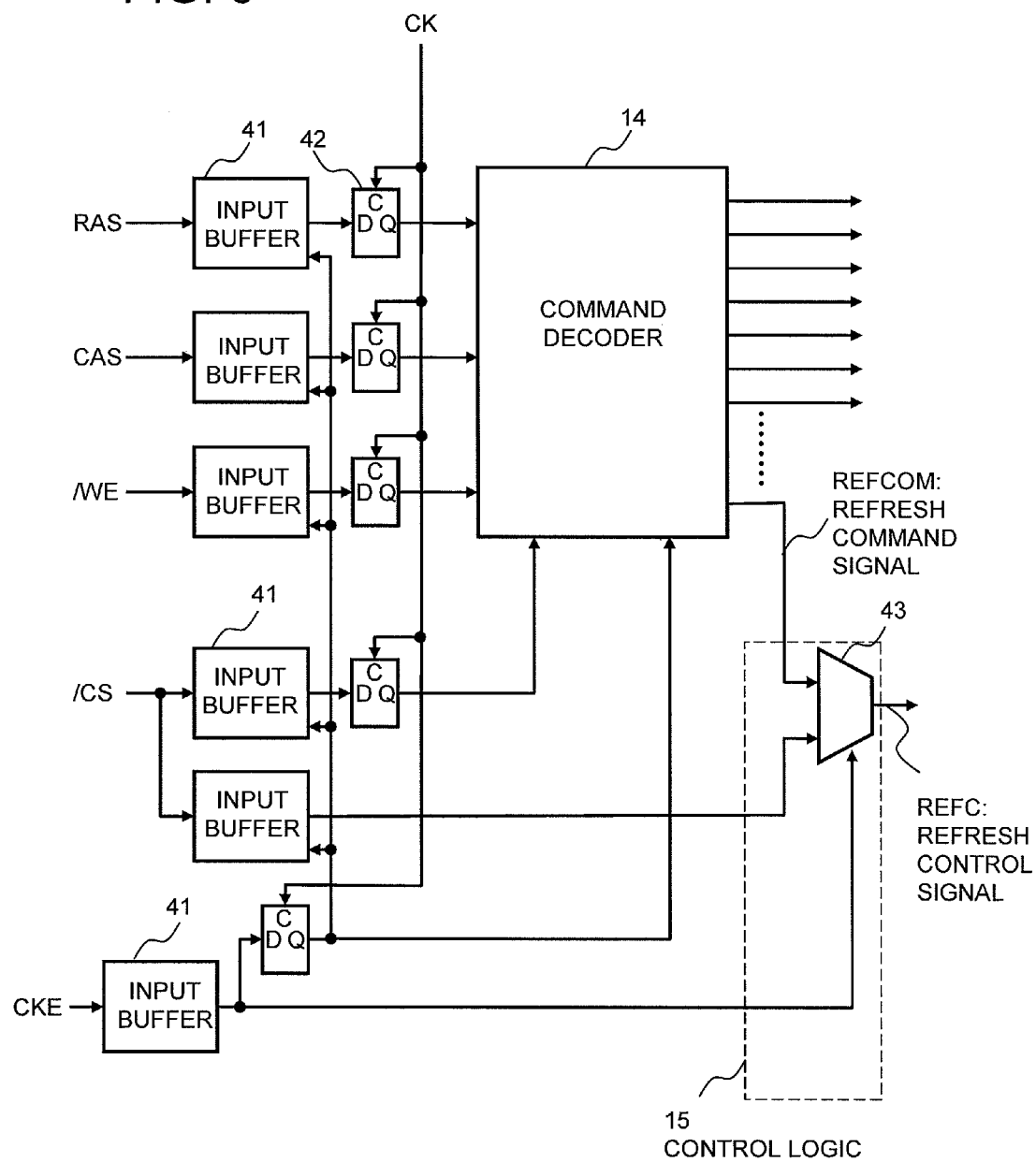
FIG. 6 is a circuit diagram showing an area surrounding a refresh control signal generation circuit in a semiconductor memory device according to another example of the present invention.

Further, for instance, as shown in FIGS. 4 and 6, the semiconductor memory device 1 of a mode of the present invention may further comprise external signal receiving circuits (41 and 42 in FIG. 4; 41 in FIG. 6) that shape the waveform of the externally supplied signal (the CS# signal supplied from a /CS terminal) and transmits the resultant signal to the refresh signal selection circuit 43.

Figure 3:
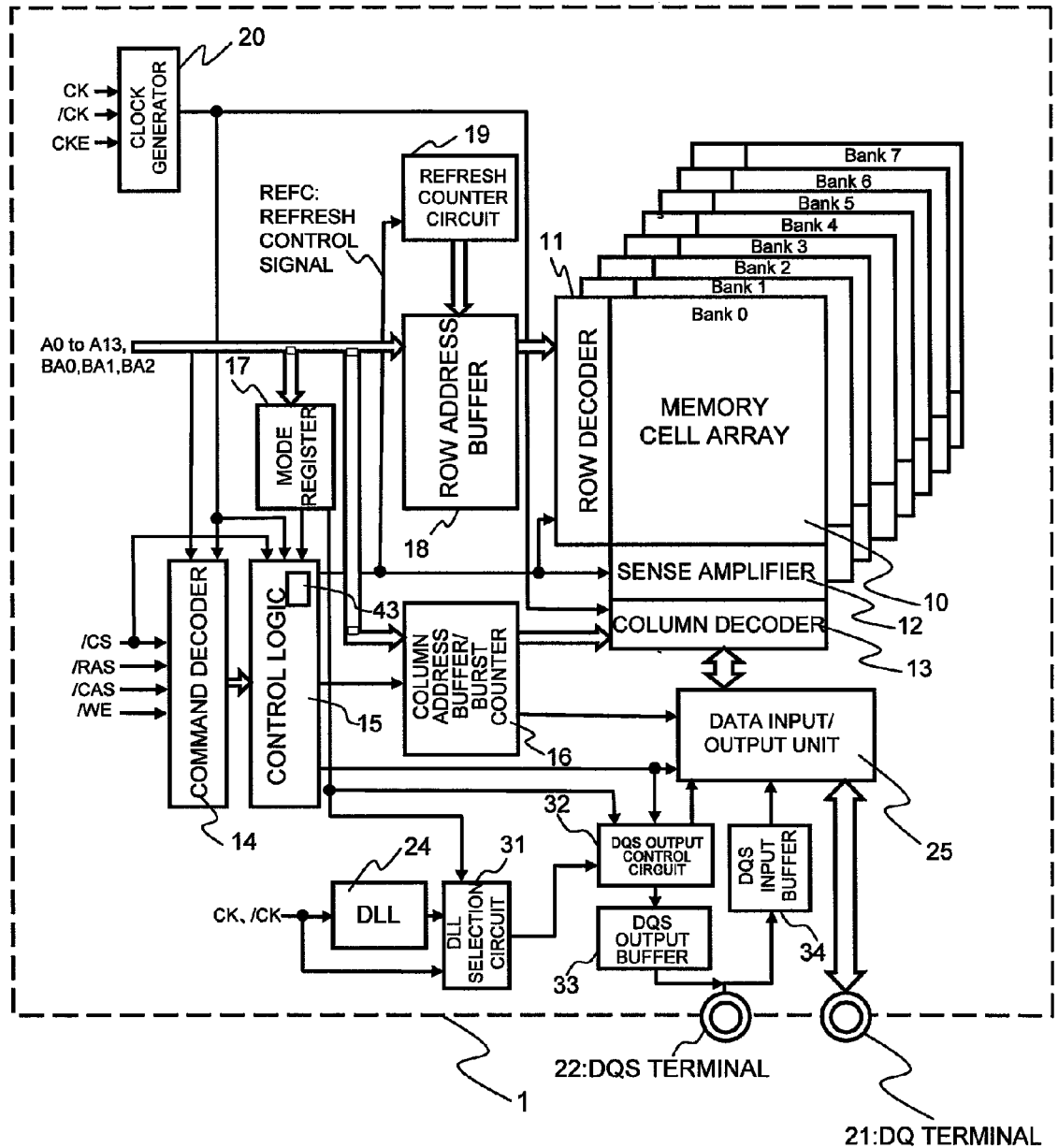
FIG. 3 is a configuration diagram of an entire semiconductor memory device according to an example of the present invention.

Further, for instance, as shown in FIG. 3, in the semiconductor memory device 1 of a mode of the present invention, the refresh control circuits (11, 12, 19) comprise a refresh counter 19; update the counter value of the refresh counter 19 each time they receive the refresh control signal REFC and perform a refresh operation; refresh the data stored in a memory cell having an address corresponding to the counter value of the refresh counter 19 among memory cells included in the dynamic memory cell array; and perform a round of refresh operations on the memory cell array 10 while the counter value of the counter 19 counts around once. A refresh operation is performed by having the refresh counter 19 count a row address of the memory cell array 10, having the row decoder 11 read out the memory cell with the row address specified by the refresh counter to the sense amplifier 12, having the sense amplifier 12 amplify the address, and writing it back to the memory cell array 10.

Further, for instance, as shown in FIGS. 4 and 6, the semiconductor memory device 1 of a mode of the present invention may comprise a chip select/CS terminal and perform a refresh operation in response to a pulse (CS#) supplied to the chip select/CS terminal during the power-down mode.

Further, for instance, as shown in FIGS. 4 and 6, the semiconductor memory device 1 of a mode of the present invention may comprise a clock enable CKE terminal and control whether or not the device enters into the power-down mode according to the logic level of an input signal CKE fed to the clock enable CKE terminal.

Further, for instance, as shown in FIG. 6, the semiconductor memory device 1 of a mode of the present invention may stop the clock CK during the power-down mode and asynchronously perform a refresh operation based on the signal /CS supplied externally. In other words, since the device does not perform any operation except for the refresh operation during the power-down mode, power consumption can be further reduced by stopping the clock and performing the refresh operation asynchronously.

Further, for instance, as shown in FIGS. 2, 5, 7 to 9, in a memory system 50 of a mode of the present invention comprising a plurality of the semiconductor memory devices 1 and a memory controller 2 that controls the plurality of the semiconductor memory devices 1, the memory controller 2 supplies the clock (CK (n), /CK (n)) to the plurality of the semiconductor memory devices 1 and supplies a read/write command in synchronization with the clock; the plurality of the semiconductor memory devices 1 perform a read/write operation in response to the supplied command; the plurality of the semiconductor memory devices 1 comprise an operation mode (before Power Down Entry and after Exit Power Down in FIGS. 5 and 7) in which a read/write operation is performed in response to the read/write command supplied by the memory controller, and a power-down mode (from Power Down Entry to Exit Power Down) in which the read/write operation is suspended; and the memory controller 2 outputs a first control signal CKE (n) that controls whether the plurality of the semiconductor memory devices 1 enter into the power-down mode or the power-down mode is ended, and a second control signal /CS (n) that has the plurality of the semiconductor memory devices 1 perform an refresh operation during the power-down mode. In other words, the memory controller controls the refresh operation during the power-down mode using the /CS signal.

Figure 2:
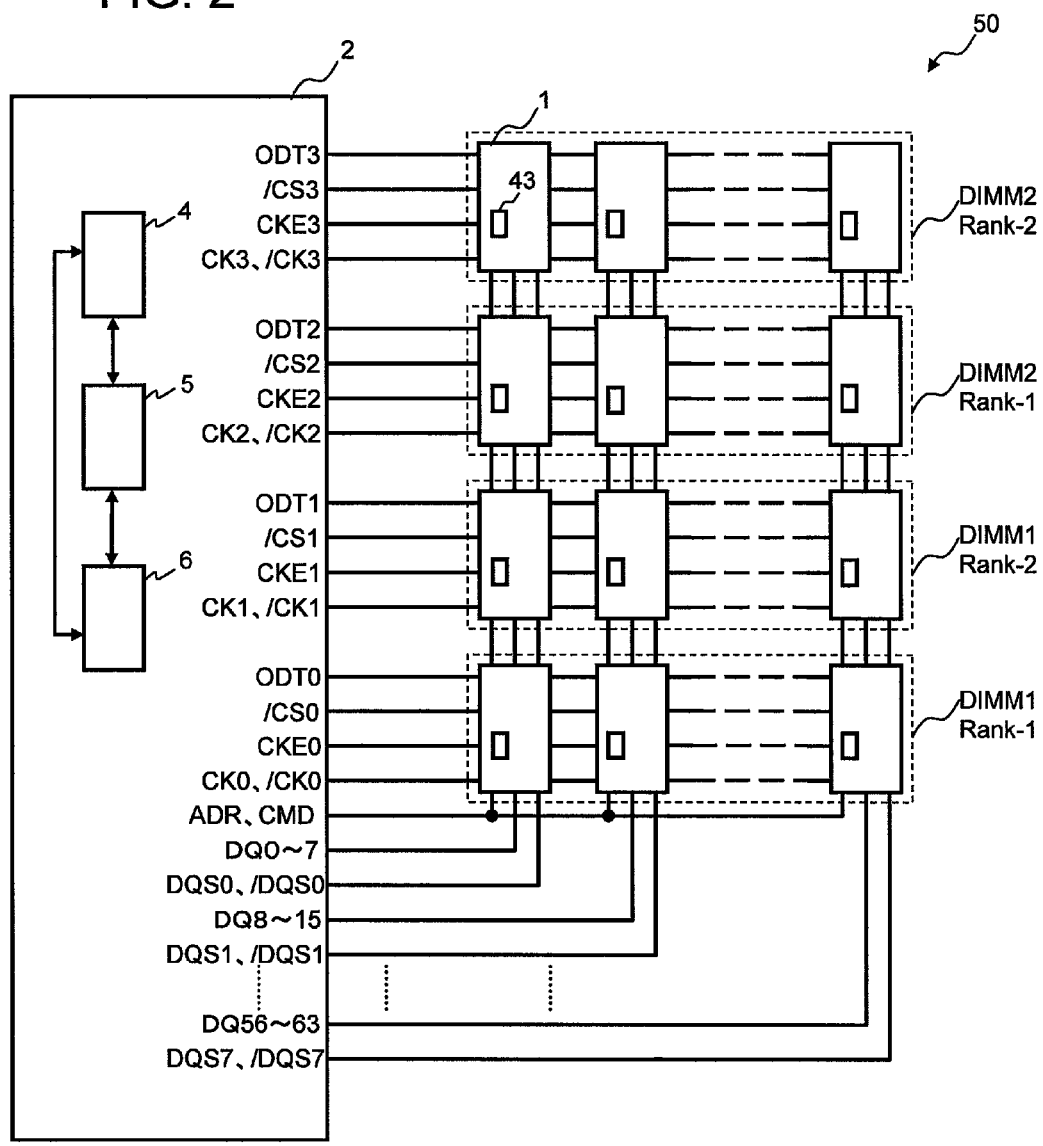
FIG. 2 is a configuration diagram of an entire memory system according to an example of the present invention.

Further, for instance, as shown in FIG. 2, in the memory system of a mode of the present invention, the plurality of the semiconductor memory devices 1 are divided into a plurality of ranks; each semiconductor memory device surrounded by a broken line in FIG. 2 is connected to the memory controller 2; the memory controller 2 supplies a command and address signals (ADR, CMD) to each rank of the semiconductor memory devices 1 in common; and the chip select signals (/CS 0 to 3), the first control signals (CKE 0 to 3), and the second control signals (/CS 0 to 3) are supplied to each rank independently. In other words, each rank can be powered down separately and a powered-down rank can be refreshed. Further, since read/write operation is stopped during the power-down mode, the chip select signals can be used as the second control signals.

Figure 5:
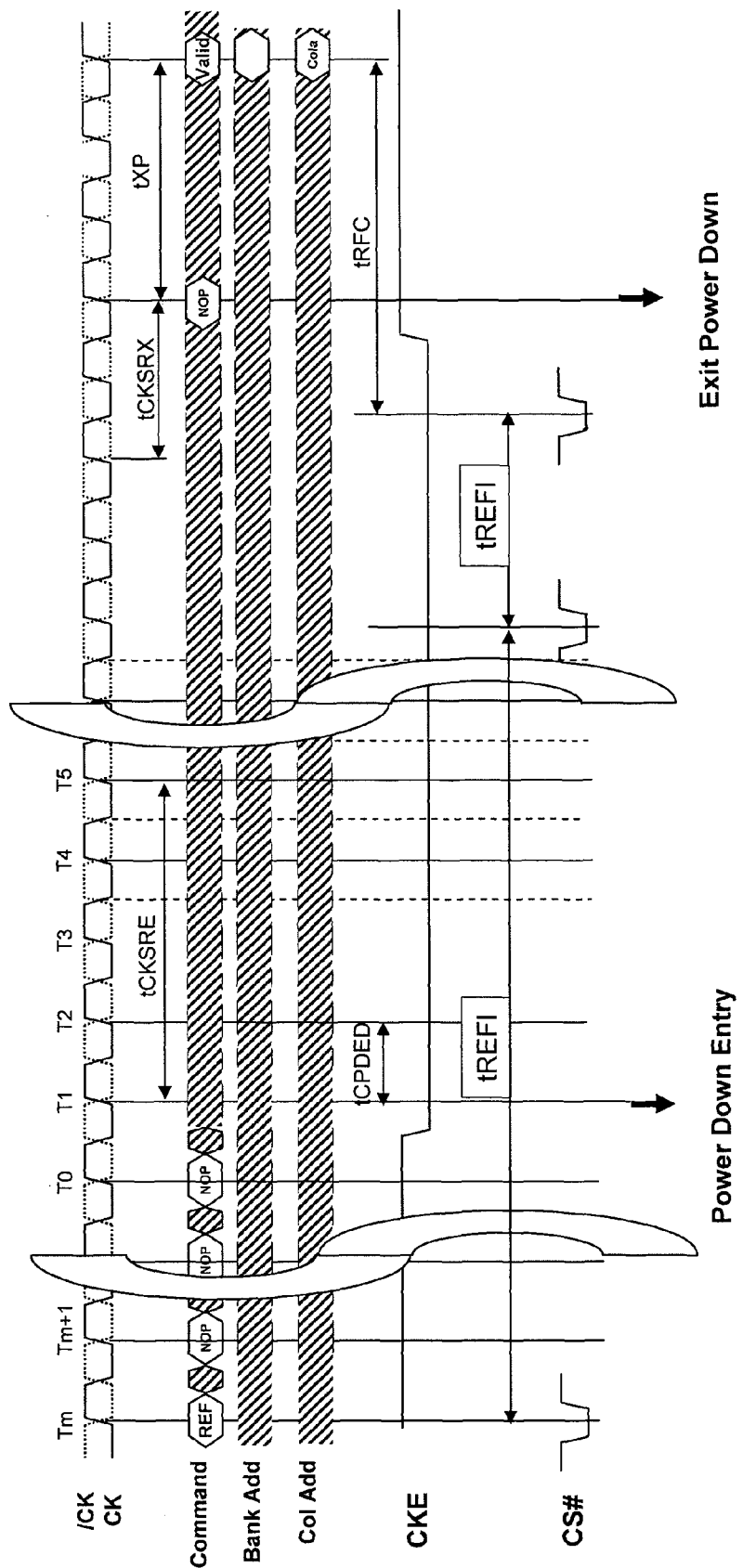
FIG. 5 is a timing chart of a power-down mode in the semiconductor memory device according to an example of the present invention.
Figure 7:
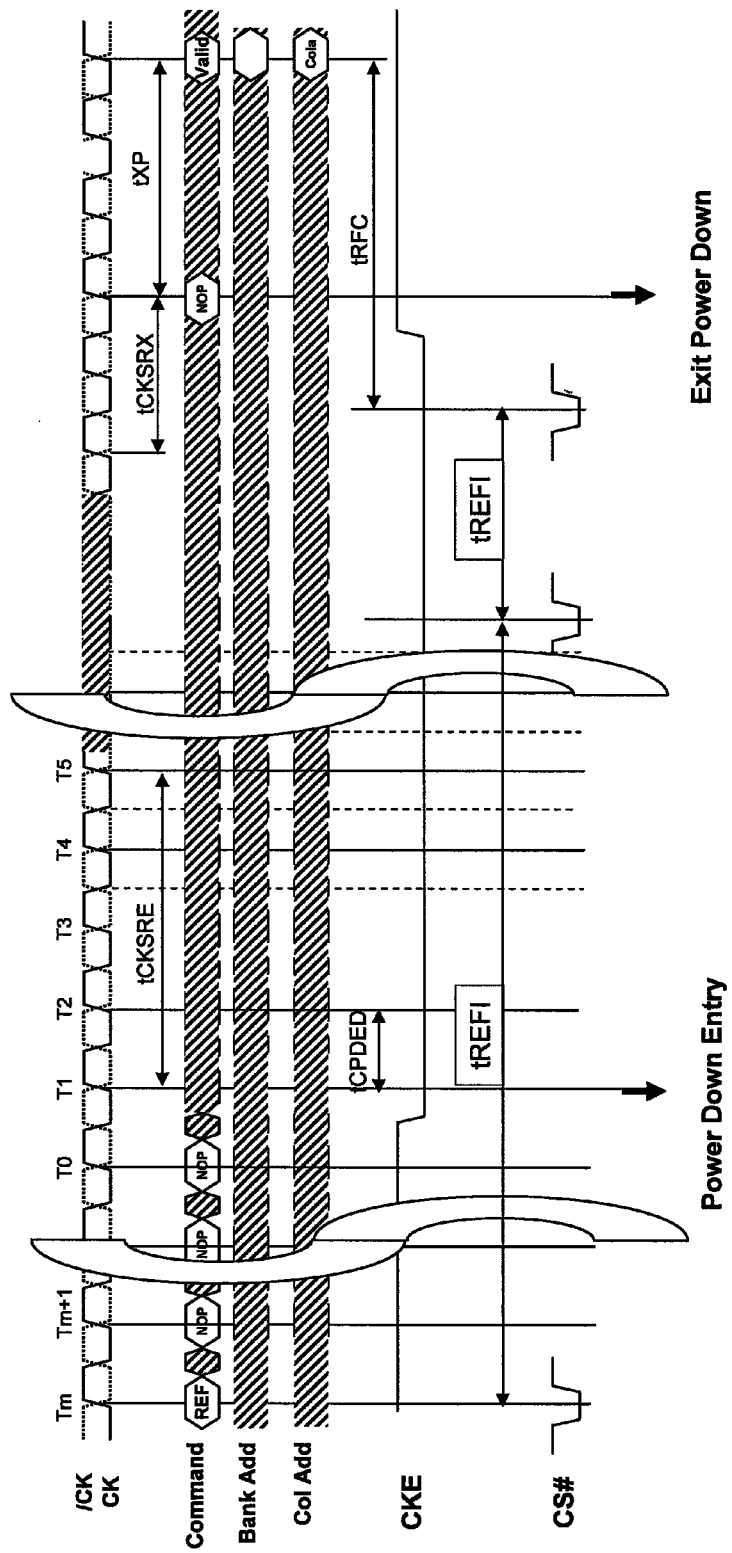
FIG. 7 is a timing chart of a power-down mode in the semiconductor memory device according to another example of the present invention.

Further, for instance, as shown in FIGS. 5 and 7, in the memory system 50 of a mode of the present invention, the first control signal may be the clock enable signal CKE, and the second control signal may be the chip select signal CS# (supplied from the /CS1 to /CS3 terminals of the memory controller 2).

Further, for instance, as shown in FIGS. 5 and 7, in the memory system 50 of a mode of the present invention, the memory controller 2 outputs the second control signal CS# as a pulse to the plurality of the semiconductor memory devices 1 during the power-down mode, and the semiconductor memory devices 1 perform an refresh operation in response to this pulse.

Further, for instance, as shown in FIGS. 5 and 7, in the memory system 50 of a mode of the present invention, when the memory controller 2 cancels the power-down mode and has the plurality of the semiconductor memory devices 1 execute a command immediately after having had the plurality of the semiconductor memory devices 1 perform a refresh operation during the power-down mode using the second control signal CS#, the memory controller 2 sends the command to the plurality of the semiconductor memory devices 1 after the cancellation of the power-down mode around the completion time of the refresh operation performed during the power-down mode. In other words, as shown in FIGS. 5 and 7, since the refresh operation performed by supplying the pulse CS# signal immediately before the cancellation of the power-down mode ends after at least a time period of tRFC has elapsed since the pulse is supplied, a new command can be supplied.

Further, in the memory system 50 (refer to FIG. 2) of a mode of the present invention, the memory controller 2 may set the plurality of the semiconductor memory devices 1 to the power-down mode in a steady state; when the necessity of read or write access to any of the semiconductor memory devices 1 arises, the memory controller 2 may cancel the power-down mode of the semiconductor memory device 1 that needs to be accessed, access the memory, and return the device to the power-down mode and have it stand by after the access has been made. According to the present invention, since the memory controller controls the refresh operation of the semiconductor memory devices during the power-down mode, read/write access from the power-down mode can be performed at high speed. Therefore, even in a state in which the memory system operates normally, the semiconductor memory devices can be set to the power-down mode by default. As a result, the power consumption of the memory system can be greatly reduced while maintaining the access speed.

Further, for instance, as shown in FIGS. 5 and 7, a refresh control method according to a mode of the present invention is for the semiconductor memory device 1 that needs to perform a refresh operation within a predetermined time period in order to hold memory contents and that has an operation mode (before Power Down Entry and after Exit Power Down in FIGS. 5 and 7) in which a read/write operation is performed in response to a command supplied externally in synchronization with a clock, and a power-down mode (from Power Down Entry to Exit Power Down) that does not accept any external read/write command; a refresh timing control signal (CS#) is supplied externally during the power-down mode; and a refresh operation is performed based on the refresh timing control signal (CS#).

Further, for instance, as shown in FIGS. 5, 7 to 9, in the refresh control method for the semiconductor memory device 1 according to a mode of the present invention, the power-down mode is canceled when a command has to be executed during the power-down mode, and when a refresh operation started during the power-down mode has not completed, the command is supplied to each semiconductor memory device around the completion time (tRFC) of the refresh operation.

Figure 9:
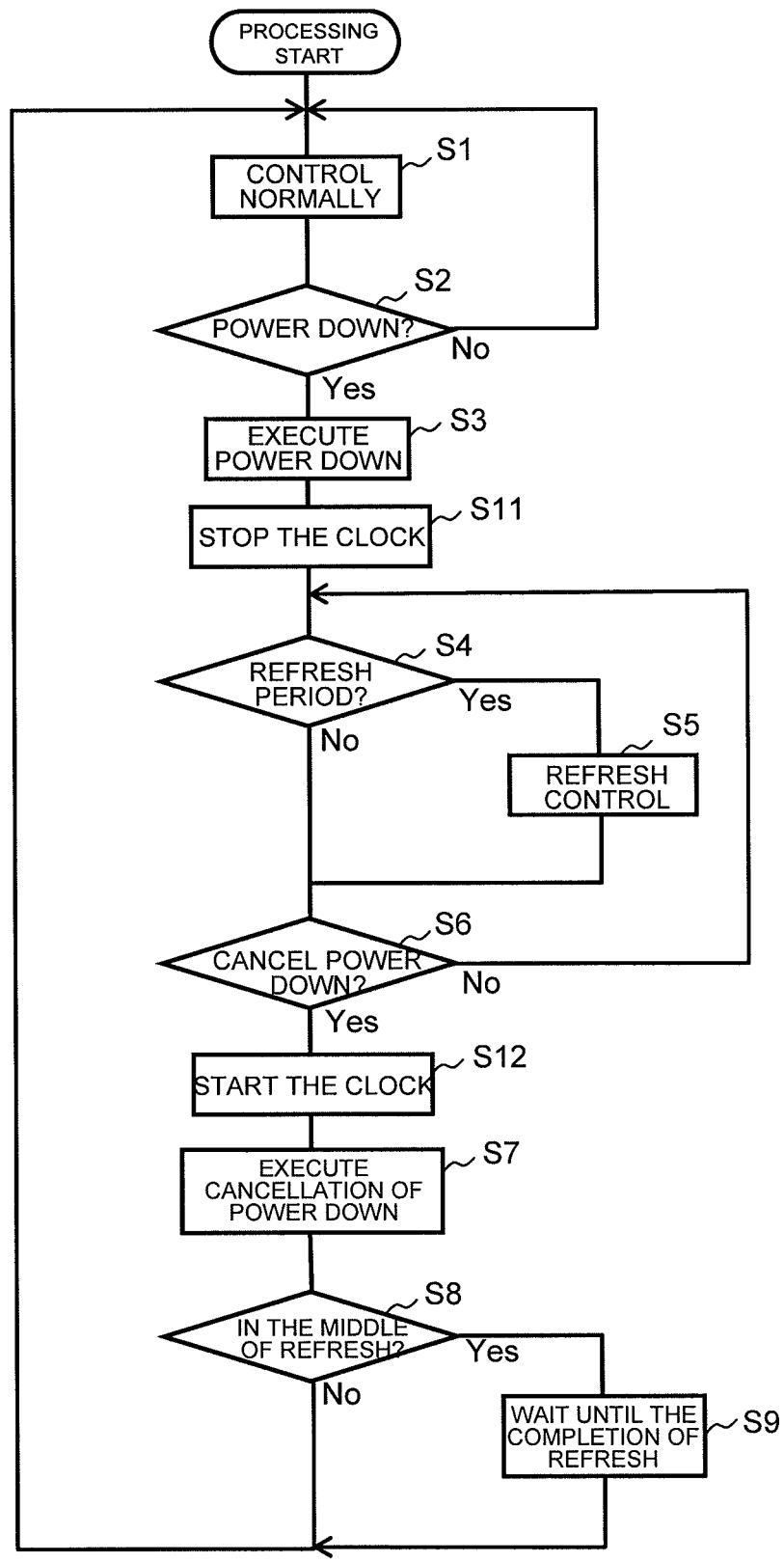
FIG. 9 is a power-down mode control flowchart of a memory controller in another example of the present invention.

Further, for instance, as shown in FIGS. 6, 7, 9, in the refresh control method for the semiconductor memory device 1 according to a mode of the present invention, the clock (CK, /CK) is stopped during the power-down mode and a refresh operation is performed asynchronously based on the refresh timing control signal CS#.

Further, in the refresh control method for the semiconductor memory device 1 according to a mode of the present invention, the semiconductor memory device is set to the power-down mode in a steady state; the power-down mode is canceled and access is made when there is a need for read or write access; and the device can be put back into the power-down mode and stand by after the completion of the access. Therefore, power consumption can be greatly reduced without decreasing the access speed. Examples will be described in detail with reference to the drawings.

EXAMPLE 1

FIG. 2 is a configuration diagram of an entire memory system according to an example of the present invention. FIG. 2 shows a 64-bit parallel read/write memory system. The semiconductor memory device 1 is 8-bit parallel read/write, and 64-bit parallel read/write is achieved by connecting eight semiconductor memory devices 1 in parallel. Further, in the memory system shown in FIG. 2, a configuration in which two ranks of the semiconductor memory devices 1 are respectively mounted on two DIMMs (Dual Inline Memory Module) is assumed. In other words, the system is constituted by a total of four ranks of semiconductor memory devices (DIMM1 Rank-1, DIMM1 Rank-2, DIMM2 Rank-1, and DIMM2-Rank-2), and each rank is further constituted by eight semiconductor memory devices 1. Overall, 4 ranks*8=32 semiconductor memory devices 1 are mounted. In FIG. 2, only three semiconductor memory devices 1 are shown out of the eight semiconductor memory devices connected in parallel. The memory controller 2 supplies a signal controlling these thirty-two semiconductor memory devices 1, and input/output of data is performed between the memory controller and the memory system.

In FIG. 2, each semiconductor memory device 1 comprises the refresh signal selection circuit 43. As described in detail later, by comprising the refresh signal selection circuit 43, each semiconductor memory device 1 is able to perform a refresh operation based on the control signal supplied by the memory controller even during the power-down mode in which the execution of read/write command is suspended.

Further, the memory controller 2 comprises a power-down mode refresh control unit 4, a memory control unit 5, and a timer 6. The power-down mode refresh control unit 4 characterizes the memory controller 2 of the present invention and controls the refresh operation when the semiconductor memory device 1 is in the power-down mode. Further, the memory control unit 5 supplies read, write, and refresh commands to the semiconductor memory device 1 and controls it when the semiconductor memory device 1 is operating normally. The timer 6 measures the time the power-down mode refresh control unit 4 and the memory control unit 5 require to control the semiconductor memory device 1.

Further, the memory controller 2 is directly connected to each semiconductor memory device 1 in FIG. 2, however, a PLL and buffer register may be disposed between the memory controller 2 and the semiconductor memory device 1 for each DIMM, making the DIMMs so-called Registered DIMMs or Fully Buffered DIMMs (FBDIMM) that synchronizes the timing between the memory controller and each DIMM. Further, the memory controller 2 may be an LSI specially functioning as a memory controller or a CPU may directly control the memory. Further, the memory controller 2 may be constituted by a plurality of LSIs.

In FIG. 2, ADR and CMD are address and command signals and connected in common from the memory controller 2 to each rank of the semiconductor memory devices 1. Further the command signals CMD include a row address strobe signal /RAS, a column address strobe signal /CAS, and a write enable signal /WE. DQ0 to DQ63 signals are bilateral data input/output signals used for read/write data transfer between the memory controller 2 and the semiconductor memory device 1. Since the semiconductor memory device 1 is supposed to have an 8-bit parallel input/output, eight semiconductor memory devices 1 are connected in parallel in order to cover 64 bits of DQ0 to D63. The data input/output signals DQ0 to DQ63 are connected to each rank in common as well. Further, DQS0 to 7 signals and /DQS0 to 7 signals are differential data strobe signals respectively. They are strobe signals of data transferred from the memory controller 2 to the semiconductor memory device 1 during write operation and from the semiconductor memory device 1 to the memory controller 2 during read operation, and are bilateral input/output signals. Further, since the data strobe signals DQS and /DQS signals outputted from the semiconductor memory device 1 during the read operation are synchronized with the change point of read data, the phase is shifted so that the data signals can be latched when the memory controller 2 uses these signals as strobe signals. These data strobe signals DQS0 to 7 and /DQS0 to 7 are connected to each rank of the semiconductor memory devices 1 in common as well. Note that discrete DQS signal and /DQS signal are respectively connected to the eight semiconductor memory devices 1 connected in parallel in each rank.

Further, the clock signals CK0 to 3, and /CK0 to 3, the clock enable signals CKE0 to 3, the chip select signals /CS0 to 3, and internal termination resistor control signal ODT0 to 3 are signals outputted from the memory controller 2 to the semiconductor memory device 1, and independent discrete signals are outputted for each rank. The clock signals CK0 to 3 and /CK0 to 3 are supplied to the semiconductor memory device 1 as the system clock, and the read/write commands are supplied from the memory controller 2 to the semiconductor memory device 1 in synchronization with this system clock. The clock enable signals CKE0 to 3 determine whether or not the clock CK is valid. When CKE is at the high level at the rising edge of the clock CK, the rising edge of the next CK is valid. It is invalid in all other cases. Command input is enabled when the chip select signals /CS0 to 3 are at a low level. Commands are ignored when /CS0 to 3 are at a high level, however, the operation will continue. By using these chip select signals, a command can be given to any rank of the semiconductor memory devices 1 among the plurality of ranks of the semiconductor memory devices 1, and access can be selectively made. Further, when the value of a termination resistor inside each semiconductor memory device 1 is not infinite, the internal termination resistor control signal ODT0 to 3 can control on/off of the termination resistor.

Next, FIG. 3 is a configuration diagram of the entire semiconductor memory device 1. In FIG. 3, 10 denotes the memory cell array; 11 the row decoder that decodes a row address and drives a word line selected; 12 the sense amplifier; 13 a column decoder that decodes a column address and selects a bit line selected; 14 the command decoder that receives a predetermined address signal, the command signal (chip select /CS, row address strobe /RAS, column address strobe /CAS, write enable /WE) and that decodes a command; 15 a control logic; 16 a column address buffer/burst counter; 17 a mode register that receives addresses A0 to A13 and signals BA0, BA1, and BA2 for selecting a bank from eight banks; 18 a row address buffer; 19 a refresh counter circuit that counts up when it receives the refresh control signal REFC and outputs a count output as a refresh address; 20 a clock generator; 21 a data input/output terminal (DQ terminal) that receives/outputs read/write data from/to the outside; 24 a DLL (Delay Lock Loop); and 25 a data input/output unit that performs data input/output between the DQ terminal and the memory cell array 10 in synchronization with the clock.

Further, a DQS output control circuit 32 that controls the output of the strobe signal DQS outputted during data read operation and a DQS output buffer 33 are provided, and when a read command is executed, the DQS output control circuit 32 adjusts the timing and the DQS signal amplified by the DQS output buffer 33 is outputted from the DQS terminal 22. Further, data is outputted from the DQ terminal 21 in synchronization with the output of the DQS signal. Further, when a write command is executed, the DQS terminal 22 receives the data strobe signal, and the data input/output unit 25 takes in the data from the DQ terminal in synchronization with the DQS signal shaped by the DQS input buffer 34.

Further, during the execution of a read command, the DQS output control circuit 32 normally receives the clock signal whose timing has been adjusted by the DLL 24, and the DQS signal is outputted in synchronization with the timing adjusted by the DLL 24. Note that there is a provided DLL selection circuit 31 that selects whether or not the DLL 24 is used, and the DQS signal is outputted based on the clock whose timing is not adjusted by the DLL 24 when it is selected that the DLL is not used according to the setting of the mode register 17. The DLL 24 always operates at high speed and requires a relatively large power consumption, however, a state of low power consumption can be maintained by turning the DLL off in the cases where the DLL does not have to be used.

Next, FIG. 4 is a circuit diagram showing an area surrounding the refresh control signal generation circuit 43 in the semiconductor memory device according to Example 1. Although this is not shown in FIG. 3, the /RAS, /CAS, /WE, and /CS signals are respectively fed to the command decoder 14 by the input buffer 41 and the input latch 42 in synchronization with the internal clock CK. When the chip select signal /CS whose timing has been adjusted via the input latch is at the low level, the input to the command data is treated as valid data, and when the chip select signal /CS is at the high level, the supplied command signal is ignored.

The chip select signal /CS is further connected to the refresh signal selection circuit 43 via the input buffer 41 and the input latch 42. The refresh command signal REFCOM, outputted when the command decoder 14 decodes a refresh command, has been fed to the refresh signal selection circuit 43. Further, the clock enable signal CKE has been fed to the command decoder 14 and the refresh signal selection circuit 43 via the input buffer 41 and the input latch 42. When the CKE signal is at the low level, the externally supplied clock is considered invalid, and the command signal fed to the command decoder 14 is ignored regardless of the logic level of the chip select signal /CS. Further, the CKE signal that has passed through the input buffer 41 and the input latch 42 is also fed to the refresh signal selection circuit 43. When the CKE signal synchronized with the internal clock is at the high level, the refresh command signal REFCOM outputted from the command decoder 14 is selected and outputted as the refresh control signal REFC, and when the CKE signal is at the low level, the /CS signal proper synchronized with the internal clock by the input latch 42 is selected and outputted as the refresh control signal REFC.

Further, the refresh control signal REFC outputted from the refresh signal selection circuit 43 activates the refresh counter circuit 19, the row decoder 11, and the sense amplifier 12 in FIG. 3, sequentially selects and reads out memory cells in the memory cell array 10 to the sense amplifier 12, and writes back the data amplified by the sense amplifier 12 to the memory cells. The refresh control circuit 19 updates the counter value every time it receives the refresh control signal REFC, and when the counter value of the refresh control circuit 19 has counted around, the entire memory cells in the memory cell array 10 have been refreshed.

Next, the operation of Example 1 will be described using FIG. 5, which is a timing chart of the power-down mode of the semiconductor memory device 1, and FIG. 8, which is a control flowchart of the memory controller. In FIG. 5, /CK and CK denote the timing of the system clock supplied by the memory controller 2 to the semiconductor memory device 1, and Command, Bank Add, and Col Add are a command, bank address, and row address supplied by the memory controller 2 to the semiconductor memory device 1. Further, CKE and CS# indicate the logic levels of the CKE signal and the CS# signal. Note that the shaded area in FIG. 5 is a "Don't Care" area. Whether the signals in the shaded area are at the high level or low level does not influence the operation in this system.

In FIG. 5, areas before Power Down Entry at time T1 and after Exit Power Down represent normal operation mode. The memory controller 2 controls the semiconductor memory device 1 in a normal manner during the normal operation mode, supplying necessary commands such as read/write and refresh commands (step S1 in FIG. 8). During the normal mode, the CKE signal is at the high level. The semiconductor memory device 1 sequentially executes commands supplied by the memory controller 2 in synchronization with the clock during this normal operation mode. In FIG. 5, the refresh command is supplied at time Tm. For instance, the memory controller 2 occasionally monitors whether or not it is necessary to set the device to the power-down mode and reduce the power consumption, such as when read/write access has not been made for a predetermined time period (step S2 in FIG. 8). Then, when a need to switch over to the power-down mode occurs, the CKE signal of the corresponding rank is pulled down, and the semiconductor memory device 1 is set to the power-down mode (step S3). In FIG. 5, the CKE signal changes to the low level after the clock has risen at time T0. Then, the device enters into the power-down mode at the time T1, the next rising time of the clock. After the device has entered into the power-down mode and time tCKSRE has elapsed, the memory controller can stop supplying the system clock. However, in Example 1, the clocks CK, /CK do not get suspended.

During the power-down mode, the memory controller 2 monitors whether or not the refresh period of the semiconductor memory device 1 has arrived (step S4). When the refresh period tEEFI arrives, a pulse is supplied to the chip select signal of the corresponding rank and the semiconductor memory device 1 is refreshed (step S5). In FIG. 5, after time tREFI has elapsed since a refresh command is supplied at the time Tm, the refresh operation is performed by supplying a low-level pulse to the chip select signal CS#. This pulse of the chip select signal CS# is taken into the inside of the semiconductor memory device 1 as the pulse of the /CS signal. As shown in FIG. 4, the pulse of the /CS signal taken into the semiconductor memory device 1 activates the refresh control circuit 19, the row decoder 11, and the sense amplifier 12 in FIG. 3 as the refresh control signal REFC via the input buffer circuit 41, the input latch 42, and the refresh signal selection circuit 43, and the refresh operation is performed. Further, this refresh time interval rREFI is defined as a standard refresh time interval, and more concretely it is approximately several microseconds.

Figure 8:
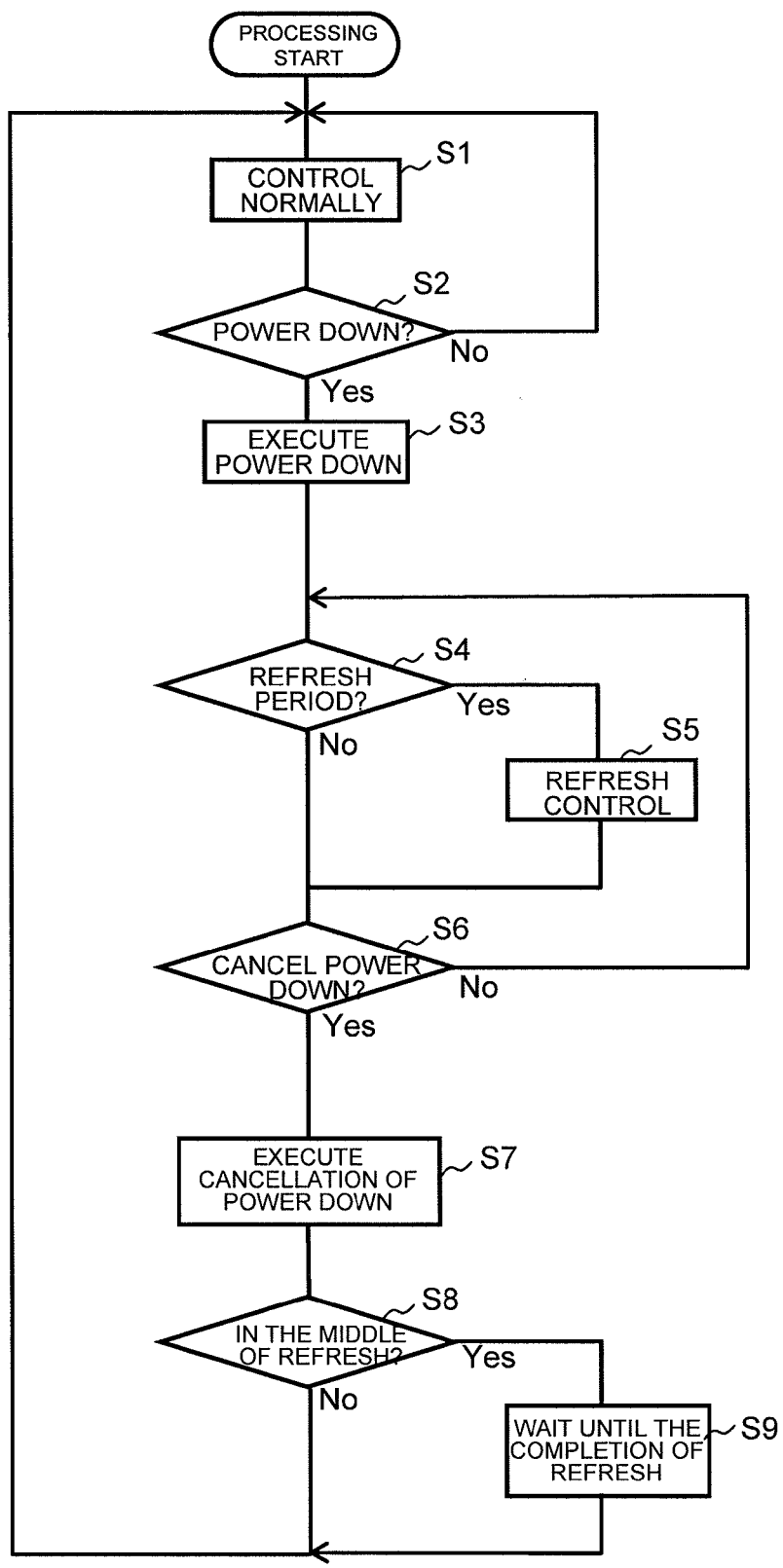
FIG. 8 is a power-down mode control flowchart of a memory controller in an example of the present invention.

In FIG. 8, when it is necessary to cancels the power-down mode, and supply a command to access to the semiconductor memory device 1 (Yes in step S6), the memory controller 2 pulls up the CKE signal of the corresponding rank from the low level to the high level and cancels the power-down mode (step S7). The cancellation of the power-down mode is performed in synchronization with the rising of the system clock immediately after the CKE signal has been pulled up from the low level to the high level (Exit Power Down in FIG. 5). The memory controller 2 checks if the cancellation of the power-down mode overlaps with the refresh operation of the semiconductor memory device (step S8). If the execution timing of the refresh operation overlaps with the cancellation of the power-down mode, the memory controller 2 waits and does not supply the read/write command until the refresh operation is completed (step S9). After the power-down mode has been canceled, the semiconductor memory device 1 is able to receive a first valid command after at least the time tRFC has elapsed since the last refresh pulse is supplied during the power-down mode and after at least time tXP has elapsed after the cancellation of the power-down mode. This time period tRFC is 100 to 200 nanoseconds, as mentioned earlier as the execution time of the refresh operation. Meanwhile, since tXP is several nanoseconds, the time tRFC mainly influences the time it takes for the semiconductor memory device 1 to be able to receive a valid command when a refresh operation is performed immediately before a cancellation of the power-down mode. However, as described earlier, when the refresh time interval tREFI and the refresh time tRFC are compared, the following expression (2) holds:

$$tREFI >> tRFC \qquad \text{Expression (2)}$$

According to the expression (2), the possibility that tRFC restricts the execution of a valid command after a cancellation of the power-down mode is low. Therefore, on the average, read/write access after a cancellation of the power-down mode can be made at high speed. If a cancellation of the power-down mode and a refresh operation overlap, the device returns to the normal command execution state after waiting for the time tRFC (the step S1). In other words, since the memory controller 2 controls refresh operation regardless of whether or not it is in the power-down mode, the memory controller 2 is able to schedule the control of refresh operations and a valid command after a cancellation of the power-down mode, and a cancellation of the power-down mode can be timed appropriately.

EXAMPLE 2

FIG. 6 is a circuit diagram showing an area surrounding the refresh control signal generation circuit in the semiconductor memory device according to Example 2. Compared with FIG. 4 of Example 1, the input latch 42 between the input buffer 41 that receives the /CS signal and the refresh signal selection circuit 43, and the input latch 42 between the input buffer 41 that receives the CKE signal and the refresh signal selection circuit 43 are omitted. Otherwise, Example 2 is configured identically to Example 1 in FIG. 4. In Example 2, out of the signals fed to the refresh signal selection circuit 43, the CKE signal and the /CS signal are directly fed without being synchronized with the internal clock signal CK by the input latch 42. Therefore, even in a state in which the internal clock CK is suspended during the power-down mode, a refresh operation can be performed by supplying a pulse as the /CS signal, disregarding the system clock CK.

FIG. 7 is a timing chart during the power-down mode of the semiconductor memory device according to Example 2. Compared with FIG. 5, which is the timing chart of Example 1, the clocks /CK and CK are "Don't Care" during the power-down mode. Therefore, the clock supplied by the memory controller 2 to the semiconductor memory device 1 is suspended during this period, and the power consumption of the semiconductor memory device can be further reduced. In FIG. 7, time tCKSRE is the time period between the start of the power-down mode and the time when it becomes possible to suspend the clock, and time tCKSRX is the time period between the activation of the clock and the time when it becomes possible to cancel the power-down mode. Since tCKSRE and tCKSRX are approximately 10 nanoseconds each, the suspension of the clock has no influence on high-speed access when the necessity of read/write access arises.

FIG. 9 is a control flowchart of the memory controller in Example 2. Compared with FIG. 8, which is the control flowchart of Example 1, FIG. 9 is identical except for an operation (step S11) in which the clock CK of the corresponding rank is suspended after the time tCKSRE has elapsed since the execution of the power-down mode (the step S3), and an operation (step S12) in which the clock suspended before the cancellation of the power-down mode (the step S7) is restarted and a first command is executed after the time tCKSRX has elapsed. Further, as shown in FIG. 2, since discrete clock signals CK and /CK, clock enable signals CKE, and chip select signals CS are supplied by the memory controller 2 to corresponding semiconductor memory devices 1 in each rank, power down control can performed rank by rank.

Further, in the examples described above, in the case where the DLL operates during the normal operation mode, if the operation of the DLL is suspended during the power-down mode, the DLL is restarted after the cancellation of the power-down mode, and it takes some time for the DLL to lock. Therefore, if high-speed operation always synchronized with the DLL clock is required, it is desirable not to suspend the DLL during the power-down mode.

Further, in a case where high-speed read/write operation is possible without using the DLL, suspending the DLL before entering into the power-down mode is especially effective since the restrictions caused by the power consumption of the DLL and the time required from the restart to the lock of the DLL will be eliminated.

Further, in the examples described above, the refresh signal selection circuit 43 switches between the refresh signals for the normal operation mode and the refresh signal for the power-down mode, however, by controlling so as to use the same refresh signal for both the normal operation mode and the power-down mode, and suspend the supply of unnecessary signals for the power-down mode and receive the refresh signal during the power-down mode, a refresh operation can be performed in response to an externally supplied signal even during the power-down mode. In this case, the present invention can be implemented without providing the refresh signal selection circuit 43.

Further, in the examples described above, by setting the semiconductor memory device 1 in the memory system 50 to the power-down mode in a default state, the power consumption of the memory system can be greatly reduced. In the memory system, it is possible to have each semiconductor memory device self-refresh itself in a default state, however, in this case, access cannot be made until the time tRFC has elapsed after a cancellation of the self refresh mode as mentioned above, since the refresh timing of semiconductor memory devices will vary even if they are in the same rank. On the other hand, according to the present invention, the refresh timing does not go out of synchronization since the memory controller controls the refresh operation on a regular basis during the power-down mode. As a result, when there is a need for access, high-speed access can be made by canceling the power-down mode.

EXAMPLE 3

Figure 10:
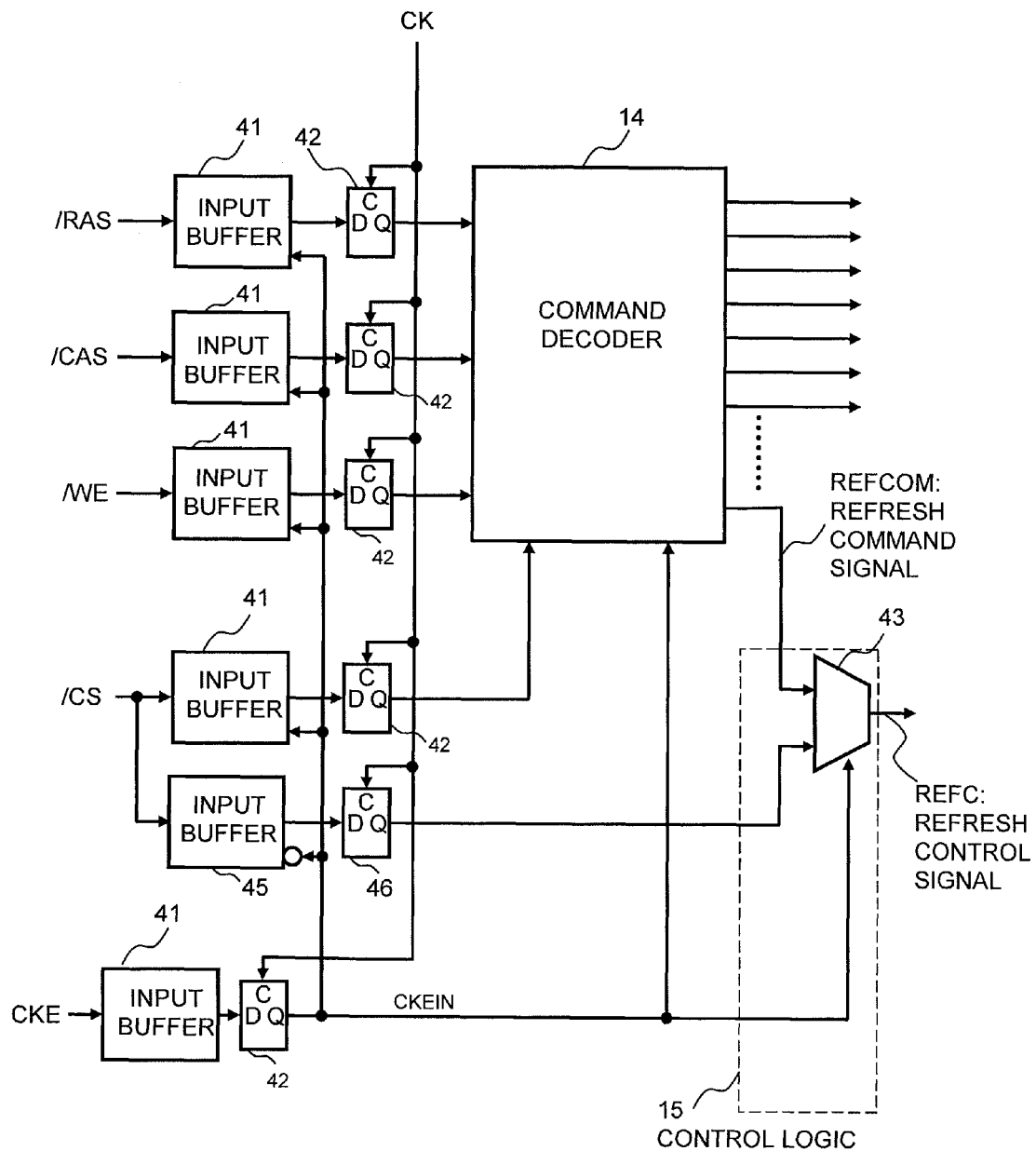
FIG. 10 is a circuit diagram showing an area surrounding a refresh control signal generation circuit in a semiconductor memory device according to the third example of the present invention.

FIG. 10 shows a circuit diagram for the vicinity of a refresh signal generation circuit in a semiconductor memory device of Example 3. In Example 1 of FIG. 4, an internal clock enable signal CKEIN, a signal obtained on taking an externally supplied clock enable signal CKE into the inside via the input buffer 41 and the input latch 42, controls the operation mode of all of the input buffers 41. By so doing, the power consumption of the input buffer 41 may be reduced when the clock enable signal is low in level.

In contrast thereto, in Example 3 shown in FIG. 10, only the input buffer 45 out of the input buffers that inputs a control signal (/CS) which is to perform refresh control in the power-down mode is supplied with an inverted version of the internal clock enable signal CKEIN. The input buffer 45 is supplied with the chip select signal /CS signal and with an inverted version of the internal clock enable signal CKEIN. An output of the input buffer 45 is coupled via an input latch 46 to the control logic 15. The control logic 15 generates the refresh control signal REFC based on the refresh command signal during the operation mode. The control logic generates the refresh control signal REFC based on a output signal of the input latch 46 during the power-down mode.

With the above configuration, it is possible to activate the input buffer 45 only during the power-down mode and to invalidate the other input buffers 41 in the power-down mode. It is thus possible to further reduce the power consumption in the power-down mode. In the present Example 3, shown in FIG. 10, the input buffers 41 per se for multiple control signals (/RAS, /CAS, /WE and /CS), entered from outside, are controlled to be invalid. The commands entered to the command decoder 14 are discounted irrespectively of the logic level of the chip select signal /CS. The other configuration and operation are the same as those of Example 1.

EXAMPLE 4

Figure 11:
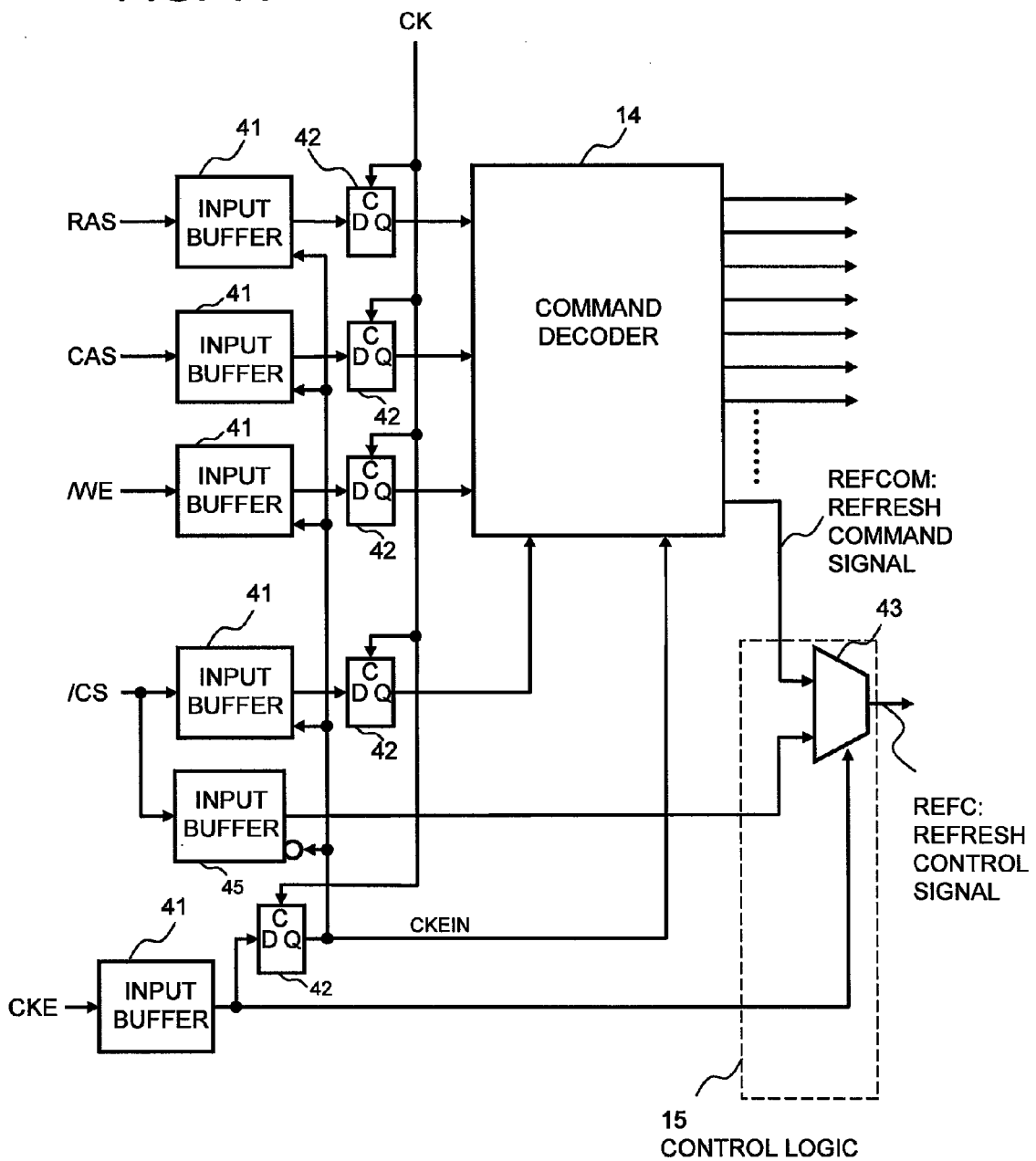
FIG. 11 is a circuit diagram showing an area surrounding a refresh control signal generation circuit in a semiconductor memory device according to the fourth example of the present invention.

FIG. 11 shows a circuit diagram for the vicinity of the refresh signal generation circuit in the semiconductor memory device of Example 4. In the present Example 4, the control of activating only the input buffer 45 for the control signal used for refresh control and invalidating the input buffers 41 for the other control signals, in the power-down mode, in such a manner as to reduce the power consumption of the input buffers 41, is applied to Example 2 in which the clock is halted in the power-down mode. In FIG. 11, the input buffers 41 per se for the multiple control signals (/RAS, /CAS, /WE and /CS), entered from outside, are again controlled to be invalid when the CKE signal is low in level. The commands entered to the command decoder 14 are discounted irrespectively of the logic level of the chip select signal /CS.

In the present invention, there are various possible modes. Some of them are shown below.

(Mode 1) as set forth as the first aspect.
(Mode 2) The semiconductor memory device according to mode 1, further comprising:
a first circuit that inputs, from outside of said semiconductor memory device, a control signal that allows accepting said first signal during said power-down mode; and
a second circuit that inputs said first signal from outside of said semiconductor memory device during said power-down mode.
A semiconductor memory device in which a refresh operation for data written in a memory cell is carried out in response to a refresh control signal, comprising:
a command decoder that generates a refresh command signal, based on a command supplied from outside of the semiconductor memory device in synchronization with a clock signal during an operation mode; and
a control logic that generates said refresh control signal based on said refresh command signal during said operation mode; said control logic generating said refresh control signal based on a first signal during a power-down mode when said clock signal is invalidated; said first signal being different from said refresh command signal and being entered from outside of said semiconductor memory device.
(Mode 3) The semiconductor memory device according to mode 2, wherein
said second circuit generates said first signal in response to change in level of a 1-bit input signal.
(Mode 4) The semiconductor memory device according to any one of modes 1 to 3, further comprising:
a plurality of input buffers;
said command, inclusive of a row address strobe signal, a column address strobe signal and a write enable signal, being formed by a plurality of bits and being generated by logical combination of said bits;
said multiple input buffers receiving said multiple bits from outside of the semiconductor memory device to deliver the bits received to said command decoder.
(Mode 5) The semiconductor memory device according to mode 3, wherein
said first signal is a chip select signal that controls validness or non-validness of inputting of said command during said operation mode.
(Mode 6) The semiconductor memory device according to any one of modes 1 to 4, wherein
said control logic generates said refresh control signal from one out of said refresh command signal and said first signal based on a clock enable signal that indicates validness or non-validness of said clock signal.
(Mode 7) The semiconductor memory device according to mode 4, wherein
said multiple input buffers are activated during said operation mode and deactivated during said power-down mode.
(Mode 8) The semiconductor memory device according to mode 2 or 3, wherein
said first and second circuits are activated at least during the power-down mode.
(Mode 9) as set forth as the second aspect.
(Mode 10) The memory controller according to mode 9, wherein, in case said semiconductor device is set to said power down mode, in which said semiconductor memory device does not accept said command, said power-down mode refresh control unit delivers said first signal to that one of said input buffers of said semiconductor memory device which is able to accept a signal from outside of said semiconductor memory device even during said power-down mode.

(Mode 11) The memory controller according to mode 9 or 10, wherein said memory controller outputs a row address strobe signal, a column address strobe signal and a write enable signal as said command.

(Mode 12) The memory controller according to any one of modes 9 to 11, wherein said power-down mode refresh control unit outputs a chip select signal, controlling validness and non-validness of inputting of said command, as said first signal.

(Mode 13) The memory controller according to mode 12, wherein said memory controller outputs a clock enable signal as a control signal that permits accepting said first signal in case said semiconductor memory device is in said power-down mode; said clock enable signal allowing or inhibiting said semiconductor device dealing with an access to said information data from outside.

(Mode 14) as set forth as the third aspect.

(Mode 15) The memory system according to mode 14, further comprising:

a second semiconductor device different from said semiconductor device, said second semiconductor device including a second memory cell array different from said memory cell array; said second semiconductor device receiving said command, a clock signal different from said clock signal, a chip select signal different from said chip select signal and a second clock enable signal different from said clock enable signal;

said memory controller also controlling said second semiconductor device to supply said command, said different clock signal, said different chip select signal and said different clock enable signal to said second semiconductor device and to periodically issue a command to refresh data retained in said different memory cell array, when said second semiconductor device is in said operation mode; said memory controller further controlling said second semiconductor device to refresh said different memory cell array based on said second clock enable signal and said different periodically issued chip select signal when said semiconductor device is in said power-down mode.

(Mode 16) The memory system according to mode 14, wherein said memory system is made up of a plurality of said semiconductor devices;

said semiconductor devices being grouped in a plurality of ranks each being composed of a preset number of the semiconductor devices; said semiconductor devices being connected to said memory controller from one of said ranks to another;

said memory controller affording an address signal that selects said command and said multiple information data to said semiconductor devices of respective ranks in common; said memory controller affording said chip select signal and said clock enable signal independently from one of said ranks to another.

(Mode 17) A semiconductor memory device comprising:

an operation mode in which a read/write operation is performed in response to a command supplied externally in synchronization with a clock, and a power-down mode in which no external read/write command is accepted;

wherein a refresh operation during said power-down mode is performed in response to a signal supplied externally.

(Mode 18) The semiconductor memory device as defined in mode 17 comprising:

a dynamic memory cell array;

a refresh control circuit that refreshes memory cell data in said dynamic memory cell array in response to a refresh control signal;

a command decoder that decodes said command and outputs a refresh command signal when the decoded command is a refresh command; and a refresh signal selection circuit that outputs said refresh command signal during said operation mode, and said externally supplied signal during said power-down mode as said refresh control signal.

(Mode 19) The semiconductor memory device as defined in mode 18 further comprising an external signal receiving circuit that shapes the waveform of said externally supplied signal and transmits the resultant signal to said refresh signal selection circuit.

(Mode 20) The semiconductor memory device as defined in mode 18 or 19, wherein said refresh control circuit comprises a refresh counter; updates a counter value of said refresh counter each time said refresh control signal is received and a refresh operation is performed; refreshes data stored in a memory cell having an address corresponding to the counter value of the refresh counter among memory cells included in the dynamic memory cell array; and performs a round of refresh operations on said memory cell array while the counter value of said counter counts around once.

(Mode 21) The semiconductor memory device as defined in any one of modes 17 to 20 comprising a chip select terminal;

wherein said refresh operation is performed in response to a pulse supplied to said chip select terminal during said power-down mode.

(Mode 22) The semiconductor memory device as defined in any one of modes 17 to 21 comprising a clock enable terminal that controls whether or not the device enters into the power-down mode according to the logic level of an input signal fed to said clock enable terminal.

(Mode 23) The semiconductor memory device as defined in any one of modes 17 to 22 wherein said clock is suspended and a refresh operation is asynchronously performed based on said externally supplied signal during said power-down mode.

(Mode 24) A memory system comprising a plurality of semiconductor memory devices and a memory controller that controls said plurality of semiconductor memory devices, wherein said memory controller supplies a clock to said plurality of semiconductor memory devices and supplies a read/write command in synchronization with said clock;

said plurality of semiconductor memory devices comprise an operation mode in which a read/write operation is performed in response to a read/write command supplied by said memory controller, and a power-down mode in which said read/write operation is suspended; and said memory controller outputs a first control signal that controls whether said plurality of semiconductor memory devices enter into said power-down mode or said power-down mode is ended, and a second control signal that has said plurality of semiconductor memory devices perform an refresh operation during said power-down mode.

(Mode 25) The memory system as defined in mode 24, wherein said plurality of semiconductor memory devices are divided into a plurality of ranks and are connected to said memory controller; said memory controller supplies a command and address signal to said each rank of semiconductor memory devices in common; and a chip select signal, said first control signal, and said second control signal are supplied to each rank independently.

(Mode 26) The memory system as defined in mode 24 or 25, wherein said first control signal is a clock enable signal, and said second control signal is a chip select signal.

(Mode 27) The memory system as defined in any one of modes 24 to 26, wherein said memory controller outputs said second control signal as a pulse to said plurality of semiconductor memory devices during said power-down mode, and said plurality of semiconductor memory devices perform a refresh operation in response to said pulse.

(Mode 28) The memory system as defined in any one of modes 24 to 27 wherein, in a case where said memory controller cancels said power-down mode and has said plurality of semiconductor memory devices execute a command immediately after having had said plurality of semiconductor memory devices perform a refresh operation in response to said second control signal during said power-down mode, said memory controller sends the command to said plurality of semiconductor memory devices after a completion of said refresh operation and the cancellation of said power-down mode.

(Mode 29) The memory system as defined in any one of modes 24 to 28, wherein said memory controller sets said plurality of semiconductor memory devices to a power-down mode in a steady state; when the necessity of read or write access to any of the semiconductor memory devices arises, said memory controller cancels the power-down mode of the semiconductor memory device that needs to be accessed, accesses the memory, and returns the device to a power-down mode and have the device stand by after the access has been made.

(Mode 30) A refresh control method for a semiconductor memory device that needs to perform a refresh operation within a predetermined time period in order to hold memory contents and that comprises an operation mode in which a read/write operation is performed in response to a command supplied externally in synchronization with a clock, and a power-down mode in which no external read/write command is accepted, wherein
a refresh timing control signal is supplied externally during said power-down mode, and a refresh operation is performed based on said refresh timing control signal.

(Mode 31) The refresh control method as defined in mode 30, wherein said power-down mode is canceled when a command has to be executed during said power-down mode, and when a refresh operation started during said power-down mode has not completed, the command is supplied to said semiconductor memory device after the completion of the refresh operation.

(Mode 32) The refresh control method for a semiconductor memory device as defined in mode 30 or 31, wherein said clock is stopped during said power-down mode and a refresh operation is performed asynchronously based on said refresh timing control signal. (Mode 33) The refresh control method for a semiconductor memory device as defined in any one of modes 30 to 32, wherein said semiconductor memory device is set to the power-down mode in a steady state; the power-down mode is canceled and access is made when there is a need for read or write access; and the device is put back into a power-down mode and stands by after the completion of the access.

(Mode 33) The refresh control method for a semiconductor memory device as defined in any one of modes 30 to 32, wherein said semiconductor memory device is set to the power-down mode in a steady state; the power-down mode is canceled and access is made when there is a need for read or write access; and the device is put back into a power-down mode and stands by after the completion of the access.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A memory controller connected to a semiconductor device including a memory cell, the memory controller comprising:
   a memory control unit that, during a operation mode that allows said semiconductor device to deal with an access to information data from outside, periodically outputs a command that permits said semiconductor device to perform a refresh operation for data written in said memory cell; and
   a power-down mode refresh control unit that, during a power-down mode that inhibits said semiconductor device from dealing with access to said information data from outside, periodically outputs a first signal, different from said command, to said semiconductor device to execute said refresh operation,
   wherein, in case said semiconductor device is set to said power down mode, in which said semiconductor memory device does not accept said command, said power-down mode refresh control unit outputs said first signal to one of input buffers of said semiconductor memory device which is able to accept a signal from outside of said semiconductor memory device even during said power-down mode.

2. The memory controller according to claim 1, wherein said memory controller outputs a row address strobe signal, a column address strobe signal and a write enable signal as said command.

3. The memory controller according to claim 1, wherein said power-down mode refresh control unit outputs a chip select signal, controlling validness and non-validness of inputting of said command, as said first signal.

4. The memory controller according to claim 3, wherein said memory controller outputs a clock enable signal as a control signal that permits accepting said first signal in case said semiconductor memory device is in said power-down mode; said clock enable signal allowing or inhibiting said semiconductor device dealing with an access to said information data from outside.

5. A memory system comprising:
   a semiconductor device and a memory controller that controls said semiconductor device; wherein
   said semiconductor device includes a memory cell array having a plurality of information data; and a plurality of input buffers; said semiconductor device receiving a command that allows said semiconductor device to execute an access to said information data from outside, a clock signal that synchronously controls said command, a chip select signal that selects said semiconductor device and a clock enable signal that internally invalidates said clock signal to inhibit said semiconductor device from dealing with an access to said information data from outside; and wherein in case said semiconductor device is in an operation mode that allows said semiconductor device to deal with access to said information data from outside, said memory controller outputs said command, said clock signal, said chip select signal and the clock enable signal to said semiconductor device and periodically issues a command for refreshing data retained in said memory cell array;

said memory controller in case said semiconductor device is in a power down mode that inhibits said semiconductor device from dealing with an access to said information data from outside, refreshing said memory cell array based on said clock enable signal and on said chip select signal that is periodically issued, and outputting a signal to execute a refresh operation to one of said plurality of input buffers of said semiconductor memory device which is able to accept a signal from outside of said semiconductor memory device even during said power down mode.

6. The memory system according to claim 5, further comprising:

a second semiconductor device different from said semiconductor device, said second semiconductor device including a second memory cell array different from said memory cell array; said second semiconductor device receiving said command, a clock signal different from said clock signal received by said semiconductor device, a chip select signal different from said chip select signal received by said semiconductor device and a second clock enable signal different from said clock enable signal received by said semiconductor device;

said memory controller also controlling said second semiconductor device to supply said command, said different clock signal, said different chip select signal and said different clock enable signal to said second semiconductor device and to periodically issue a command to refresh data retained in said different memory cell array, when said second semiconductor device is in said operation mode; said memory controller further controlling said second semiconductor device to refresh said different memory cell array based on said different clock enable signal and different periodically issued chip select signal when said semiconductor device is in said power-down mode.

7. The memory system according to claim 5, wherein said memory system is made up of a plurality of said semiconductor devices;

said semiconductor devices being grouped in a plurality of ranks each being composed of a preset number of the semiconductor devices; said semiconductor devices being connected to said memory controller from one of said ranks to another;

said memory controller affording an address signal that selects said command and said multiple information data to said semiconductor devices of respective ranks in common; said memory controller affording said chip select signal and said clock enable signal independently from one of said ranks to another.

8. The memory controller according to claim 1, wherein said command includes a row address strobe signal, a column address strobe signal and a write enable signal; and said first signal not includes said row address strobe signal, said column address strobe signal and said write enable signal.

9. The memory controller according to claim 5, wherein said command includes a row address strobe signal, a column address strobe signal and a write enable signal; and said first signal not includes said row address strobe signal, said column address strobe signal and said write enable signal.

\* \* \* \* \*